United States Patent

Miller et al.

(10) Patent No.: US 10,389,336 B1
(45) Date of Patent: Aug. 20, 2019

(54) JOSEPHSON TRANSMISSION LINE (JTL) SYSTEM

(71) Applicants: Donald L. Miller, Export, PA (US); Ofer Naaman, Ellicott City, MD (US)

(72) Inventors: Donald L. Miller, Export, PA (US); Ofer Naaman, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/124,832

(22) Filed: Sep. 7, 2018

Related U.S. Application Data (62) Division of application No. 14/943,767, filed on Nov. 17, 2015, now Pat. No. 10,122,350.

(51) Int. Cl.
  *G06F 1/04* (2006.01)
  *H03K 3/38* (2006.01)
  *G06N 10/00* (2019.01)
  *H03K 19/195* (2006.01)

(52) U.S. Cl.
  CPC ............... *H03K 3/38* (2013.01); *G06N 10/00* (2019.01); *G06F 1/04* (2013.01); *H03K 19/195* (2013.01); *H03K 19/1952* (2013.01)

(58) Field of Classification Search
  CPC .... G06F 1/04; H03K 19/195; H03K 19/1952; H03K 3/38
  See application file for complete search history.

(56) References Cited

U.S. PATENT DOCUMENTS

| | | |
|---|---|---|
| 3,341,380 A | 9/1967 | Mcts |
| 4,117,354 A | 9/1978 | Geewala |
| 4,132,956 A | 1/1979 | Russer |
| 4,149,097 A | 4/1979 | Faris |
| 4,274,015 A | 6/1981 | Faris |
| 4,360,898 A | 11/1982 | Faris |

(Continued)

FOREIGN PATENT DOCUMENTS

| | | |
|---|---|---|
| EP | 0467104 | 1/1992 |
| EP | 3217336 | 9/2017 |

(Continued)

OTHER PUBLICATIONS

Canadian Office Action corresponding to Canadian Patent Application No. 2973060, dated Dec. 18, 2018.

(Continued)

*Primary Examiner* — Terrell S Johnson
(74) *Attorney, Agent, or Firm* — Tarolli, Sundheim, Covell & Tummino LLP (57) ABSTRACT

One embodiment describes a Josephson transmission line (JTL) system. The system includes a plurality of JTL stages that are arranged in series. The system also includes a clock transformer comprising a primary inductor configured to propagate an AC clock signal and a secondary inductor arranged in a series loop with at least two of the plurality of JTL stages. The clock transformer can be configured to propagate a single flux quantum (SFQ) pulse to set a respective one of the plurality of JTL stages in response to a first phase of the AC clock signal and to reset the respective one of the plurality of JTL stages in response to a second phase of the AC clock signal that is opposite the first phase.

11 Claims, 6 Drawing Sheets

(56) References Cited

U.S. PATENT DOCUMENTS

| | | | |
|---|---|---|---|
| 4,916,335 | A | 4/1990 | Goto |
| 5,051,627 | A | 9/1991 | Schneier |
| 5,099,152 | A | 3/1992 | Suzuki |
| 5,309,038 | A | 5/1994 | Harada |
| 5,942,950 | A | 8/1999 | Merenda |
| 6,188,236 | B1 | 2/2001 | Wikborg |
| 6,486,756 | B2 | 11/2002 | Tarutani |
| 6,507,234 | B1 | 1/2003 | Johnson |
| 6,518,786 | B2 | 2/2003 | Herr |
| 6,549,059 | B1 | 4/2003 | Johnson |
| 6,617,643 | B1 | 9/2003 | Goodwin-Johansson |
| 6,724,216 | B2 | 4/2004 | Suzuki |
| 6,750,794 | B1 | 6/2004 | Durand |
| 6,865,639 | B2 | 3/2005 | Herr |
| 6,897,468 | B2 | 5/2005 | Blais |
| 6,960,780 | B2 | 11/2005 | Blais |
| 6,960,929 | B2 | 11/2005 | Bedard |
| 7,129,870 | B2 | 10/2006 | Hirano |
| 7,498,832 | B2 | 3/2009 | Baumgardner |
| 7,613,765 | B1 | 11/2009 | Hilton |
| 7,714,605 | B2 | 5/2010 | Baumgardner |
| 7,724,020 | B2 | 5/2010 | Herr |
| 7,772,871 | B2 | 8/2010 | Herr |
| 7,772,872 | B2 | 8/2010 | Lewis |
| 7,782,077 | B2 | 8/2010 | Herr |
| 7,977,964 | B2 | 7/2011 | Herr |
| 8,022,722 | B1 | 9/2011 | Pesetski |
| 8,111,083 | B1 | 2/2012 | Pesetski |
| 8,508,280 | B2 | 8/2013 | Naaman |
| 8,975,912 | B2 | 3/2015 | Chow |
| 9,000,621 | B2 | 4/2015 | Ichikawa |
| 9,208,861 | B2 | 12/2015 | Herr |
| 9,281,057 | B1 | 3/2016 | Herr |
| 9,735,776 | B1 | 8/2017 | Abdo |
| 10,122,352 | B1 | 11/2018 | Miller |
| 2002/0063643 | A1 | 5/2002 | Smith |
| 2002/0190381 | A1 | 12/2002 | Herr |
| 2003/0011398 | A1 | 1/2003 | Herr |
| 2003/0016069 | A1 | 1/2003 | Furuta |
| 2003/0039138 | A1 | 2/2003 | Herr |
| 2003/0040440 | A1 | 2/2003 | Wire |
| 2003/0115401 | A1 | 6/2003 | Herr |
| 2003/0183935 | A1 | 10/2003 | Herr |
| 2003/0207766 | A1 | 11/2003 | Esteve |
| 2004/0120444 | A1 | 6/2004 | Herr |
| 2004/0201099 | A1 | 10/2004 | Herr |
| 2004/0201400 | A1 | 10/2004 | Herr |
| 2005/0001209 | A1 | 1/2005 | Hilton |
| 2005/0023518 | A1 | 2/2005 | Herr |
| 2005/0098773 | A1 | 5/2005 | Vion |
| 2005/0110106 | A1 | 5/2005 | Goto |
| 2005/0224784 | A1 | 10/2005 | Amin |
| 2005/0231196 | A1 | 10/2005 | Tarutani |
| 2006/0091490 | A1 | 5/2006 | Chen |
| 2007/0052441 | A1 | 3/2007 | Taguchi |
| 2009/0082209 | A1 | 3/2009 | Bunyk |
| 2009/0084991 | A1 | 4/2009 | Ichimura |
| 2009/0153180 | A1 | 6/2009 | Herr |
| 2009/0289638 | A1 | 11/2009 | Farinelli |
| 2009/0322374 | A1 | 12/2009 | Przybysz |
| 2011/0175062 | A1 | 7/2011 | Farinelli |
| 2012/0094838 | A1 | 4/2012 | Bunyk |
| 2013/0015885 | A1 | 1/2013 | Naaman |
| 2013/0043945 | A1 | 2/2013 | McDermott |
| 2015/0092465 | A1* | 4/2015 | Herr ..................... B82Y 10/00 363/125 |
| 2016/0034609 | A1* | 2/2016 | Herr ..................... G06F 17/505 716/104 |

FOREIGN PATENT DOCUMENTS

| | | |
|---|---|---|
| JP | S6192036 | 5/1986 |
| JP | 2001345488 | 12/2001 |
| WO | 199808307 | 2/1998 |
| WO | 2003090162 | 10/2003 |
| WO | 2005093649 | 10/2005 |
| WO | 200850864 | 5/2008 |
| WO | 2009157532 | 12/2009 |
| WO | 2010028183 | 3/2010 |
| WO | 2016127021 | 8/2016 |

OTHER PUBLICATIONS

Berns et al., "Coherent Quasiclassical Dynamics of a Persistent Current Qubit", Physical Review Letters APS USA, vol. 97, No. 15, pp. 150502, Oct. 13, 2006.

Garanin et al., Effects of nonlinear sweep in the Landau-Zener-Stueckelberg effect, Physical Review B, vol. 66, No. 17, pp. 174438-1-174438-11, Nov. 1, 2002.

Koch, et al.: "A NRZ—Output Amplifier for RSFQ Circuits", IEEE Transaction on Applied Superconductivity, vol. 9, No. 2, pp. 3549-3552, Jun. 1999.

Wulf et al., Dressed States of Josephson Phase Qubit Coupled to an LC Circuit, IEEE Transaction on Applied Superconductivity IEEE USA, vol. 15, No. 2, pp. 356-859, Jun. 2, 2005.

Schuenemann C. et al. "Interleaved Josephson junction tree decoder," IBM Technical Disclosure Bulletin, International Business Machines Corp. (Thorwood), US, vol. 18, No. 12, Apr. 30, 1976, pp. 4168, line 1—p. 4170, line 29; figures I, II.

International Search Report & Written Opinion corresponding to International Application No. PCT/US2018/051076 dated Jan. 2, 2019.

International Search Report & Written Opinion corresponding to International Application No. PCT/US2018/0042466 dated Dec. 12, 2018.

International Search Report & Written Opinion corresponding to International Application No. PCT/US2008/050864 dated Sep. 6, 2008.

Ortlepp et al.; "Experimental Analysis of a new Generation of compact Josephson-inductance-based RSFQ Circuits"; Authors are with the Institute of Information Technology, University of Technology Germany.

Internation Search Report & Written Opinion corresponding to International Application No. PCT/US2008/072017 dated Feb. 23, 2009.

Gopalakrishnan, R. et al.: "Novel Very High IE Structures Based on the Directed BBHE Mechanism for Ultralow-Power Flash Memories", IEEE Electron Device Letters, vol. 26, No. 3, Mar. 2005.

Choi, W. Y. et al.: "80nm Self-Aligned Complementary I-MOS Using Double Sidewall Spacer and Elevated Drain Structure and Its Applicability to Amplifiers with High Linearity", IEEE Electron Device Letters, vol. 8, No. 5, dated 2004.

Choi, W. Y. et al.: "Novel Tunneling Devices with Multi-Functionality", Japanese Journal of Applied Physics, vol. 16, No. 1B, dated 2007; pp. 2622-2625.

International Search Report corresponding to International Application No. PCT/US2009/045167, dated Feb. 5, 2010.

Semenov, et. al, "SFQ Control Circuits for Josephson Junction Qubits", IEEE Trans. on Applied Superconductivity, vol. 13, No. 2, Jun. 2003, pp. 960-965.

Canadian Office Action corresponding to Canadian Patent Application No. 2882109 dated Mar. 11, 2016.

Polonsky, et. al., Transmission of Single-Flux-Quantum Pulses along Superconducting Microstrip Lines, IEEE Trans. on Applied Superconductivity, vol. 3, No. 1, Mar. 1993, pp. 2598-2600.

Ohki et. al., "Low-Jc Rapid Single Flux Quantum (RSFQ) Qubit Control Circuit", IEEE Transactions on Applied Superconductivity, vol. 17, No. 2, Jun. 2007.

Allman, et al: "rf-SQUID-Mediated Coherent Tunable Coupling Between a Superconducting Phase Qubit and a Lumped-Element Resonator"; Physical Review Letters, 2010 The American Physical Society, PRL 104, week ending Apr. 30, 2010, pp. 177004-1 thru 177004-4.

Johnson, et al.: "A Scalable Control System for a Superconducting Adiabatic Quantum Optimization Processor"; arXiv:0907.3757v2 fquant-phI Mar. 24, 2010, pp. 1-14.

(56) References Cited

OTHER PUBLICATIONS

Saira, et al.: "Entanglement genesis by anciila-based parity measurement in 20 circuit QED" Physical review letters 1 i 2.7 (201 4): 070502.
Galiautdinov, et al.: "Resonator-zero-qubit architecture for superconducting qubits" Physical Review A 85.4 (201 2): 042321, Department of Electrical Engineering and Physics, University of California. pp. 1-11.
Bourassa, et al.: "Ultra.strong coupling regime of cavity QED with phase-biased flux qubits" Physical Review A 803 (2009): 032109.
International Search Report corresponding to International Application No. PCT/US2015/052666 dated Jan. 3, 2016.
RSFQubit , RSFQ Control of Josephson Junctions Qubits, D7: Report on the Evaluation of the RSFQ Circuitry for Qubit Control, Sep. 1, 2005, pp. 1-16.
Herr, et al: "Ultra-Low-Power Superconductor Logic", Journal of Applied Physics, American Institute of Physics, US, vol. 109, No. 10, May 17, 2011, pp. 103903-103903, XP012146891, ISSZN: 0021-8979, 001: 10.1063/1.3585849, p. 2, left-hand column, paragraph 4—right-hand column, paragraph 1; Fig. 1.
Gui-Long, et al., "A Simple Scheme to Generate X-type Four-charge Entangled States in Circuit QED", Chinese Physics B, Chinese Physics B, Bristol GB, vol. 21, No. 4, Apr. 5, 2012 (Apr. 5, 2012), pp. 44209/1-5. XP020221550, ISSN: 1674-1056, DOI: 10.1088/1674-1056/21/4/044209.
International Search Report corresponding to International Application No. PCT/US2016/053412, dated Dec. 21, 2016.
International Search Report corresponding to International Application No. PCT/US2013/054161, dated Feb. 25, 2014.
Herr, et al.: "Ultra-Low-Power Superconductor Logic", Journal of Applied Physics, American Institute of Physics, US, vol. 109, No. 10, May 17, 2011, pp. 103903-103903, XP012146891, ISSN: 0021-8979, D01: 10.1063/1.3585849, p. 2, left-hand column, paragraph 4—right-hand column, paragraph 1; Fig. 1.

\* cited by examiner

JOSEPHSON TRANSMISSION LINE (JTL) SYSTEM

RELATED APPLICATIONS

This application is a divisional application claiming priority from U.S. patent application Ser. No. 14/943,767, filed 17 Nov. 2015, which is incorporated herein in its entirety.

TECHNICAL FIELD

The present invention relates generally to computer systems, and specifically to a Josephson transmission line (JTL) system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 Kelvin. Multiple Josephson junctions and inductors can be provided in a specific arrangement to provide a Josephson transmission line to propagate data signals in superconductor computing systems.

SUMMARY

One embodiment includes a Josephson transmission line (JTL) system. The system includes a plurality of JTL stages that are arranged in series. The system also includes a clock transformer comprising a primary inductor configured to propagate a single flux quantum (SFQ) pulse to propagate an AC clock signal and a secondary inductor arranged in a series loop with at least two of the plurality of JTL stages, the clock transformer being configured to set a respective one of the plurality of JTL stages from a first flux state to a second flux state in response to a first phase of the AC clock signal and to set the respective one of the plurality of JTL stages from a second flux state to a first flux state in response to a second phase of the AC clock signal that is opposite the first phase.

Another embodiment includes a method for propagating an SFQ pulse in a JTL system. The method includes providing a DC bias current through a primary inductor of a bias transformer to induce a bias signal via a secondary inductor. The method also includes providing an AC clock signal through a primary inductor of each of at least one clock transformer, the at least one clock transformer comprising secondary inductors arranged in series with the secondary inductor associated with the bias transformer in a loop with at least two of a plurality of JTL stages of the JTL. The method further includes providing unipolar SFQ pulses at an input of the JTL. Each of the unipolar SFQ pulses can be propagated through the plurality of JTL stages based on the bias signal and each respective one of the JTL stages switching from a first flux state to a second flux state in response to the respective one of the unipolar SFQ pulses and a first phase of the AC clock signal. The plurality of JTL stages sequentially switches from the second flux state to the first flux state in response to a second phase of the AC clock signal that is opposite the first phase.

Another embodiment includes a JTL system. The system includes a first JTL stage that is controlled via at least one first clock transformer comprising a respective at least one primary inductor that propagates an in-phase component of an AC clock signal and a respective at least one secondary inductor that is arranged in a first series loop with the first JTL stage. The first JTL stage can be switched from a first flux state to a second flux state in response to an SFQ pulse at a first phase of the in-phase component and from a second flux state to a first flux state in response to a second phase of the in-phase component opposite the first phase. The system also includes a second JTL stage arranged in series with the first JTL stage. The second JTL stage can be controlled via at least one second clock transformer comprising a respective at least one primary inductor that propagates a quadrature-phase component of the AC clock signal and a respective at least one secondary inductor that is arranged in a second series loop with the second JTL stage. The second JTL stage can be switched from the first flux state to the second flux state in response to the SFQ pulse at a first phase of the quadrature-phase component and from the second flux state to the first flux state in response to a second phase of the quadrature-phase component opposite the first phase. The system also includes a third JTL stage arranged in series with the second JTL stage. The third JTL stage can be controlled via the first clock transformer and is arranged in the first series loop. The third JTL stage can be switched from the first flux state to the second flux state in response to the SFQ pulse at the second phase of the in-phase component and from the second flux state to the first flux state in response to the first phase of the in-phase component. The system further includes a fourth JTL stage arranged in series with the third JTL stage. The fourth JTL stage can be controlled via the second clock transformer and is arranged in the second series loop. The fourth JTL stage can be switched from the first flux state to the second flux state in response to the SFQ pulse at the second phase of the quadrature-phase component and from the second flux state to the first flux state in response to the first phase of the quadrature-phase component.

DETAILED DESCRIPTION

The present invention relates generally to computer systems, and specifically to a Josephson transmission line (JTL) system. The JTL system can include a plurality of JTL stages that can each be configured as superconducting quantum interference devices (SQUIDs), such that each stage can include a pair of Josephson junctions and an inductor. The JTL system can also include at least one clock transformer, one associated with each of the JTL stages, and at least one bias transformer. The bias transformer can include a primary inductor that propagates a DC bias current, and thus induces a bias signal on the secondary inductor. The clock transformers can propagate an AC clock signal on primary inductors, and can thus induce the AC clock signal on the secondary inductors. The secondary inductors of the clock transformers and the secondary inductor of the bias transformer can be arranged in a series loop with the respective JTL stages. Thus, on a first phase of the AC clock signal, a given one of the JTL stages can switch to one of a first flux state and a second flux state in response to a single flux quantum (SFQ) pulse to propagate the SFQ pulse from the respective JTL stage to a next JTL stage of the JTL. On a second phase of the AC clock signal that is opposite the first phase, the JTL stage can switch to the other of the first and second flux states, and thus can be reset absent a negative SFQ pulse. Therefore, the JTL system can provide self-resetting of the JTL stages without providing negative SFQ pulses, and can thus propagate a unipolar SFQ pulse stream.

As an example, the AC clock signal can be configured as a quadrature signal that includes an in-phase component and a quadrature-phase component (e.g., 90° out-of-phase with respect to each other). The JTL stages can be arranged as a first JTL stage, a second JTL stage, a third JTL stage, and a fourth JTL stage that are arranged in a sequence. The first and third JTL stages can be arranged in a first series loop with secondary inductors of respective first and third clock transformers associated with the in-phase component. Similarly, the second and fourth JTL stages can be arranged in a second series loop with secondary inductors of respective second and fourth clock transformers associated with the quadrature-phase component. Therefore, the first JTL stage and the second JTL stage are set from the first flux state to the second flux state via the first clock transformer and the second clock transformer, respectively, in response to the first phase of the in-phase component and the quadrature-phase component, respectively, of the AC clock signal, and are set from the second flux state to the first flux state in response to the second phase of the in-phase component and the quadrature-phase component, respectively, of the AC clock signal. Similarly, the third JTL stage and the fourth JTL stage are set from the second flux state to the first flux state via the third clock transformer and the fourth clock transformer, respectively, in response to the second phase of the in-phase component and the quadrature-phase component, respectively, of the AC clock signal, and are set from the first flux state to the second flux state in response to the first phase of the in-phase component and the quadrature-phase component, respectively, of the AC clock signal.

Figure 1:
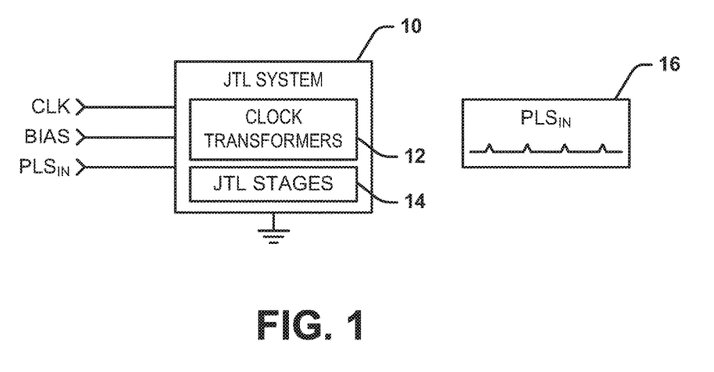
FIG. 1 illustrates an example of a JTL system.

FIG. 1 illustrates an example of a JTL system 10. The JTL system 10 can be implemented in any of a variety of quantum and/or classical circuit systems to propagate SFQ pulses, such as between circuit devices. As described herein, the JTL system 10 can be implemented to propagate unipolar encoded SFQ pulses, and thus does not require negative SFQ pulses as typically required in a reciprocal quantum logic (RQL) computing system. As an example, the JTL system 10 can be implemented in a rapid single flux quantum (RSFQ) logic system, or in a combination RSFQ and RQL system.

The JTL system 10 includes a plurality of JTL stages 12 that can each be associated with a given phase of an AC clock signal CLK. As an example, the AC clock signal CLK can be a quadrature clock signal, such that the AC clock signal includes an in-phase component and a quadrature-phase component. Each of the JTL stages 12 can be configured, for example, as SQUIDs. Thus, each of the JTL stages 12 can include a pair of Josephson junctions and an inductor. The JTL system 10 can also include at least one clock transformer 14, such that each of the clock transformers 14 can be associated with a respective one of the JTL stages 12. As an example, the clock transformers 14 can propagate the AC clock signal on primary inductors, and can thus induce the AC clock signal on the secondary inductors of the clock transformers 14. The secondary inductors of the clock transformers 14 can be arranged in a series loop with the respective JTL stages 12. Additionally, a DC flux bias signal BIAS can be provided to the JTL system 10 to provide a flux bias to the JTL stages 12 to facilitate the switching of flux states, as described herein.

In the example of FIG. 1, the JTL system 10 receives SFQ pulses, demonstrated as a signal $PLS_{IN}$, at an input. The signal $PLS_{IN}$ can be provided as a unipolar encoded sequence of SFQ pulses, which, as described in greater detail herein, can be absent negative SFQ pulses (as demonstrated at 16). Based on the arrangement of the clock transformers 14 with respect to the JTL stages 12, on a first phase of the AC clock signal, a given one of the JTL stages 12 can switch to one of a first flux state and a second flux state in response to an SFQ pulse of the signal $PLS_{IN}$ to propagate the SFQ pulse from the respective JTL stage 12 to a next JTL stage 12 of the JTL system 10. On a second phase of the AC clock signal that is opposite the first phase (e.g., 180° out-of-phase), the JTL stage 12 can switch to the other of the first and second flux states based on the SFQ pulse of the signal $PLS_{IN}$ propagating through a respective one of the JTL stages 12, and thus can be reset absent a negative SFQ pulse. Therefore, the JTL system 10 can provide self-resetting of the JTL stages 12 without providing negative SFQ pulses, and can thus propagate a unipolar SFQ pulse stream.

Figure 2:
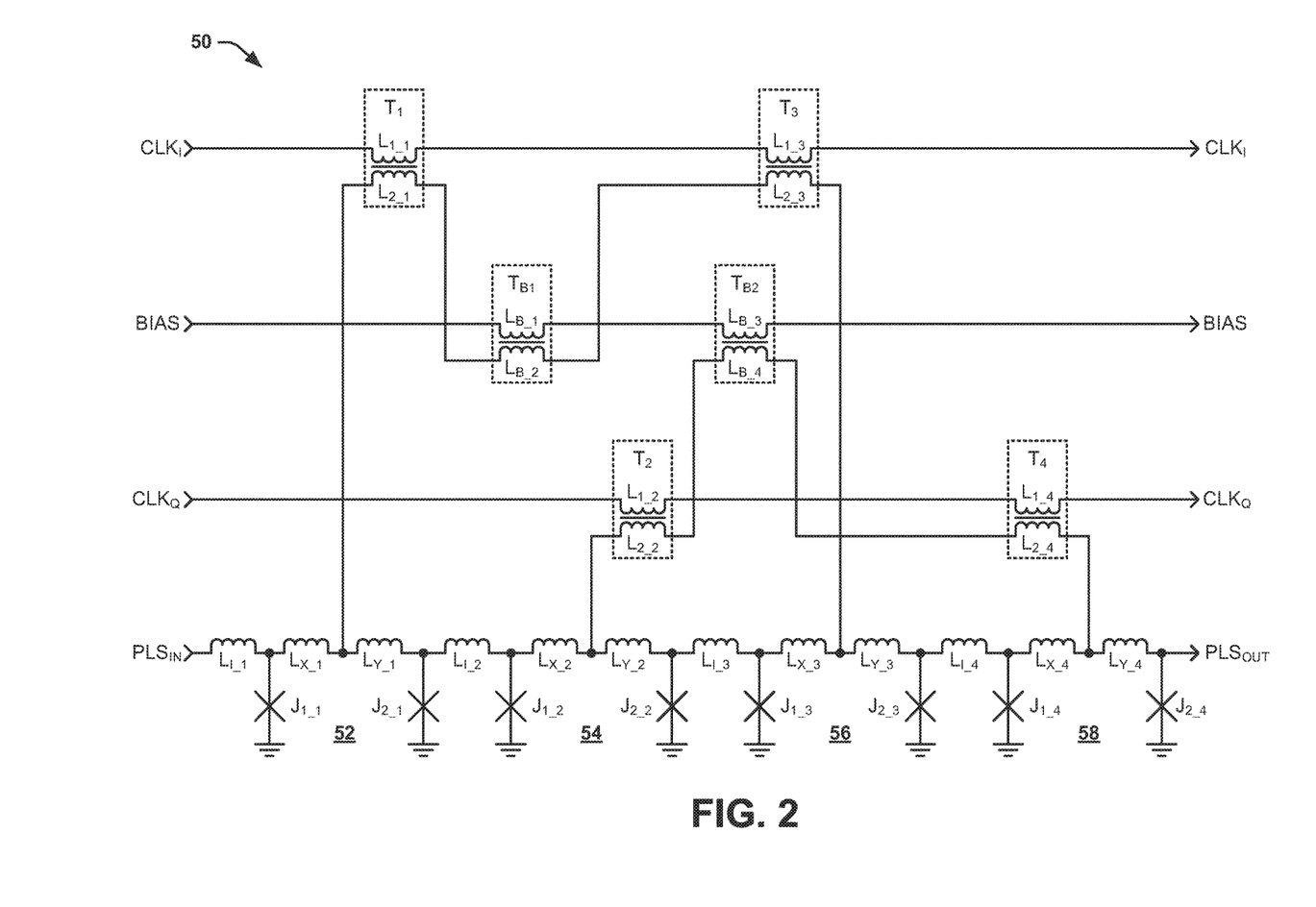
FIG. 2 illustrates an example of a JTL circuit.

FIG. 2 illustrates an example of a JTL circuit 50. The JTL circuit 50 can correspond to the JTL system 10 in the example of FIG. 1, and can thus be configured to propagate a sequence of unipolar SFQ pulses. The JTL circuit 50 includes a first JTL stage 52, a second JTL stage 54, a third JTL stage 56, and a fourth JTL stage 58. The JTL stages 52, 54, 56, and 58 are sequentially arranged in series with respect to each other to propagate a signal $PLS_{IN}$ that can be provided as a sequence of unipolar SFQ pulses. In the example of FIG. 2, the AC clock signal is demonstrated as a quadrature signal including an in-phase component $CLK_I$ and a quadrature-phase component $CLK_Q$. Therefore, the in-phase component $CLK_I$ and the quadrature-phase component $CLK_Q$ can collectively correspond to the AC clock signal, such as can be implemented for RQL circuits.

Each of the JTL stages 52, 54, 56, and 58 are configured substantially similarly with respect to each other, and are each arranged as SQUIDs. The first JTL stage 52 includes a first Josephson junction $J_{1\_1}$, a second Josephson junction $J_{2\_1}$, an inductor $L_{X\_1}$, and an inductor $L_{Y\_1}$. The second JTL stage 54 includes a first Josephson junction $J_{1\_2}$, a second Josephson junction $J_{2\_2}$, an inductor $L_{X\_2}$, and an inductor $L_{Y\_2}$. The third JTL stage 56 includes a first Josephson junction $J_{1\_3}$, a second Josephson junction $J_{2\_3}$, an inductor $L_{X\_3}$, and an inductor $L_{Y\_3}$. The fourth JTL stage 58 includes a first Josephson junction $J_{1\_4}$, a second Josephson junction $J_{2\_4}$, an inductor $L_{X\_4}$, and an inductor $L_{Y\_4}$. The first JTL stage 52 receives the input signal $PLS_{IN}$ via an inductor $L_{I\_1}$ and is separated from the second JTL stage 54 by an inductor $L_{I\_2}$. The second JTL stage 54 and the third JTL stage 56 are separated by an inductor $L_{I\_3}$, and the third JTL stage 56 and the fourth JTL stage 58 are separated by an inductor $L_{I\_4}$. After the fourth JTL stage 58, the JTL circuit 50 can output SFQ pulses as an output signal $PLS_{OUT}$.

The JTL circuit 50 also includes a plurality of clock transformers that are associated with each of the JTL stages 52, 54, 56, and 58. In the example of FIG. 2, the clock transformers include a first clock transformer $T_1$ that is associated with the first JTL stage 52, a second clock transformer $T_2$ that is associated with the second JTL stage 54, a third clock transformer $T_3$ that is associated with the third JTL stage 56, and a fourth clock transformer $T_4$ that is associated with the fourth JTL stage 58. Additionally, the JTL circuit 50 includes a first bias transformer $T_{B1}$ that is associated with the first and third JTL stages 52 and 56, and a second bias transformer $T_{B2}$ that is associated with the second and fourth JTL stages 54 and 58.

The clock transformers $T_1$ and $T_3$ include primary inductors $L_{1\_1}$ and $L_{1\_3}$, respectively, through which the in-phase component $CLK_I$ flows, and the clock transformers $T_2$ and $T_4$ include primary inductors $L_{1\_2}$ and $L_{1\_4}$, respectively, through which the quadrature-phase component $CLK_Q$ flows. In addition, the bias transformers $T_{B1}$ and $T_{B2}$ include primary inductors $L_{B\_1}$ and $L_{B\_3}$ through which a DC bias signal BIAS flows. The clock transformer $T_1$ provides inductive coupling of the in-phase component $CLK_I$ to the first JTL stage 52 via a secondary inductor $L_{2\_1}$ that is coupled between the inductors $L_{X\_1}$ and $L_{Y\_1}$. Similarly, the clock transformer $T_3$ provides inductive coupling of the in-phase component $CLK_I$ to the third JTL stage 56 via a secondary inductor $L_{2\_3}$ that is coupled between the inductors $L_{X\_3}$ and $L_{Y\_3}$. In the example of FIG. 2, the bias transformer $T_{B1}$ includes a secondary inductor $L_{B\_2}$ that is arranged in series with the secondary inductors $L_{2\_1}$ and $L_{2\_3}$ to form a series loop between the first and third JTL stages 52 and 56. In a similar manner, the clock transformer $T_2$ provides inductive coupling of the quadrature-phase component $CLK_Q$ to the second JTL stage 54 via a secondary inductor $L_{2\_2}$ that is coupled between the inductors $L_{X\_2}$ and $L_{Y\_2}$. Similarly, the clock transformer $T_4$ provides inductive coupling of the quadrature-phase component $CLK_Q$ to the fourth JTL stage 58 via a secondary inductor $L_{2\_4}$ that is coupled between the inductors $L_{X\_4}$ and $L_{Y\_4}$. In the example of FIG. 2, the bias transformer $T_{B2}$ includes a secondary inductor $L_{B\_4}$ that is arranged in series with the secondary inductors $L_{2\_2}$ and $L_{2\_4}$ to form a series loop between the second and fourth JTL stages 54 and 58.

Based on the arrangement of the clock transformers $T_1$, $T_2$, $T_3$, and $T_4$ relative to the respective JTL stages 52, 54, 56, and 58, a flux state of the JTL stages 52, 54, 56, and 58 can be sequentially switched at each phase and each opposite phase of the in-phase and quadrature-phase components $CLK_I$ and $CLK_Q$. As an example, each of the first in-phase component $CLK_I$ and the quadrature-phase component $CLK_Q$ can include a first phase corresponding to a positive peak (e.g., in a first half of a respective period) and a second phase that is opposite the first phase, and thus corresponding to a negative peak (e.g., in a second half of a respective period). Therefore, as described in greater detail in the examples of FIGS. 3-7, the secondary inductors $L_{2\_1}$, $L_{2\_2}$, $L_{2\_3}$, and $L_{2\_4}$ of the clock transformers $T_1$, $T_2$, $T_3$, and $T_4$ can sequentially provide current in each of 90° intervals of the respective in-phase and quadrature-phase components $CLK_I$ and $CLK_Q$ to sequentially switch the flux states of the JTL stages 52, 54, 56, and 58 in response to propagation of the SFQ pulse through each of the respective JTL stages 52, 54, 56, and 58. Thus, the JTL circuit 50 can track the flux state of the secondary inductors $L_{B\_2}$ and $L_{B\_4}$ of the bias transformers $T_{B1}$ and $T_{B2}$, and thus the flux state of the JTL stages 52, 54, 56, and 58 through each alternating first and second phase of the in-phase and quadrature-phase components $CLK_I$ and $CLK_Q$ to propagate an SFQ pulse through the JTL circuit 50 in one of the JTL stages 52, 54, 56, and 58 to set the flux state of the respective one of the JTL stages 52, 54, 56, and 58 and to concurrently reset the flux state of an associated one of the JTL stages 52, 54, 56, and 58 in the same series loop.

Figure 3:
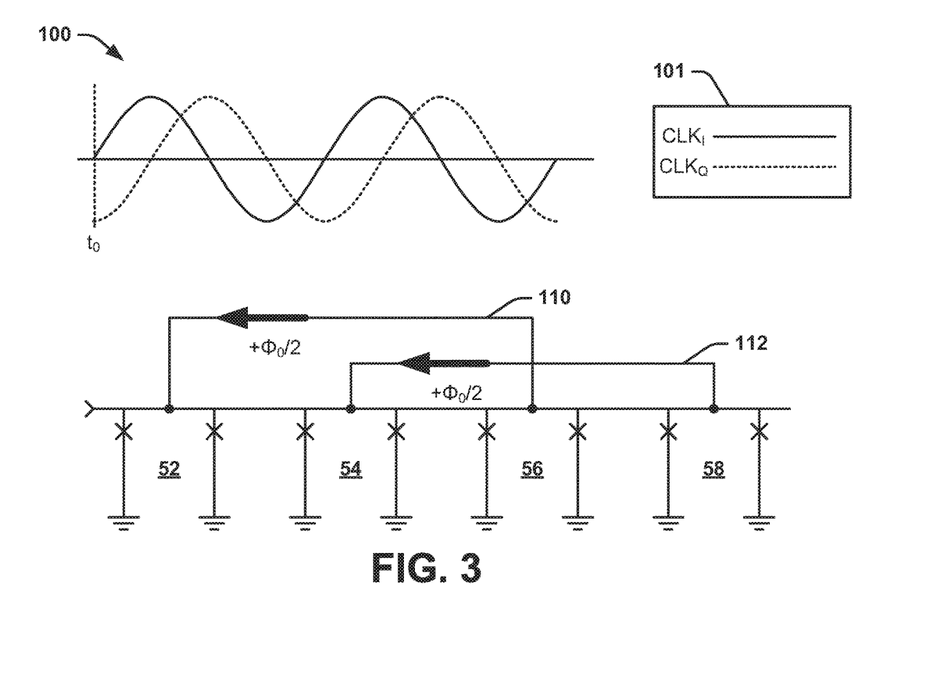
FIG. 3 illustrates an example of a timing diagram.
Figure 4:
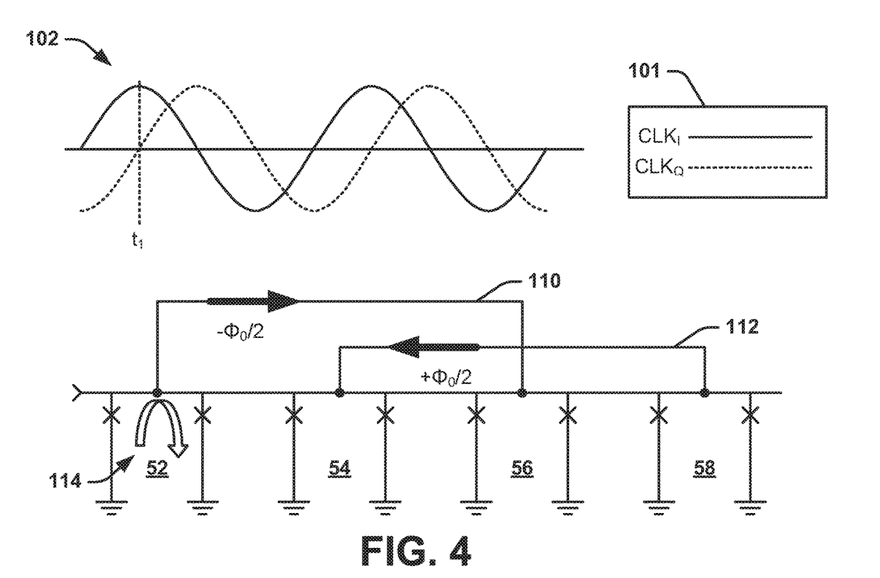
FIG. 4 illustrates an example diagram of flux in a JTL circuit.
Figure 5:
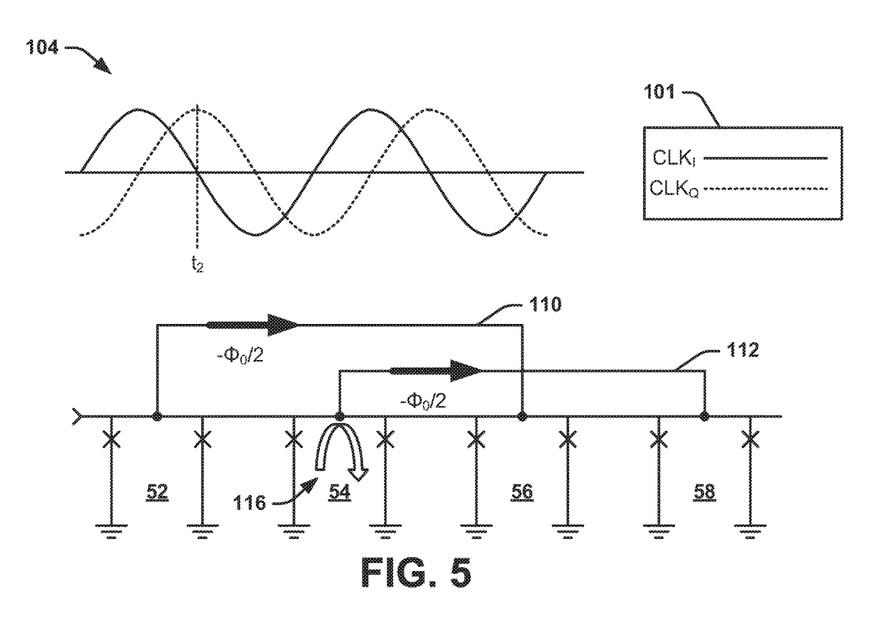
FIG. 5 illustrates another example diagram of flux in a JTL circuit.
Figure 6:
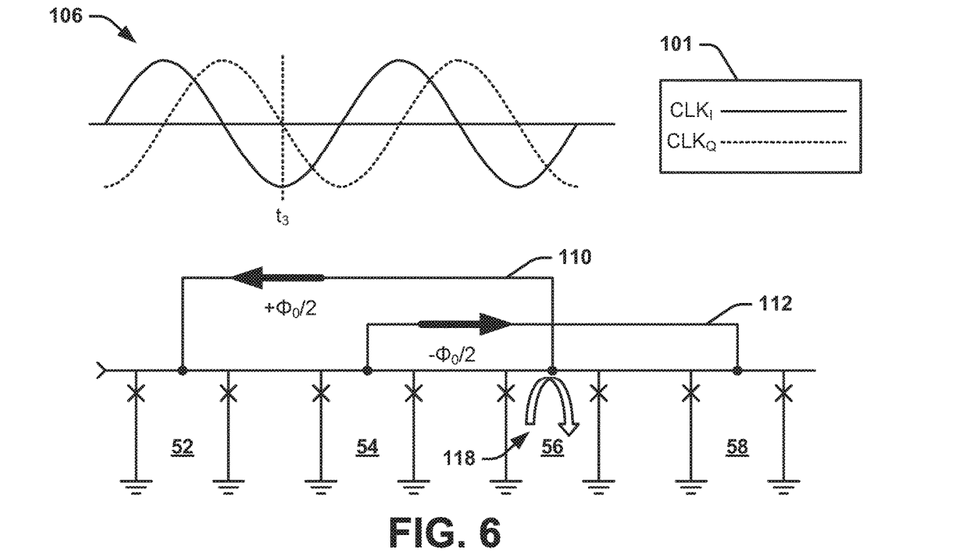
FIG. 6 illustrates yet another example diagram of flux in a JTL circuit.
Figure 7:
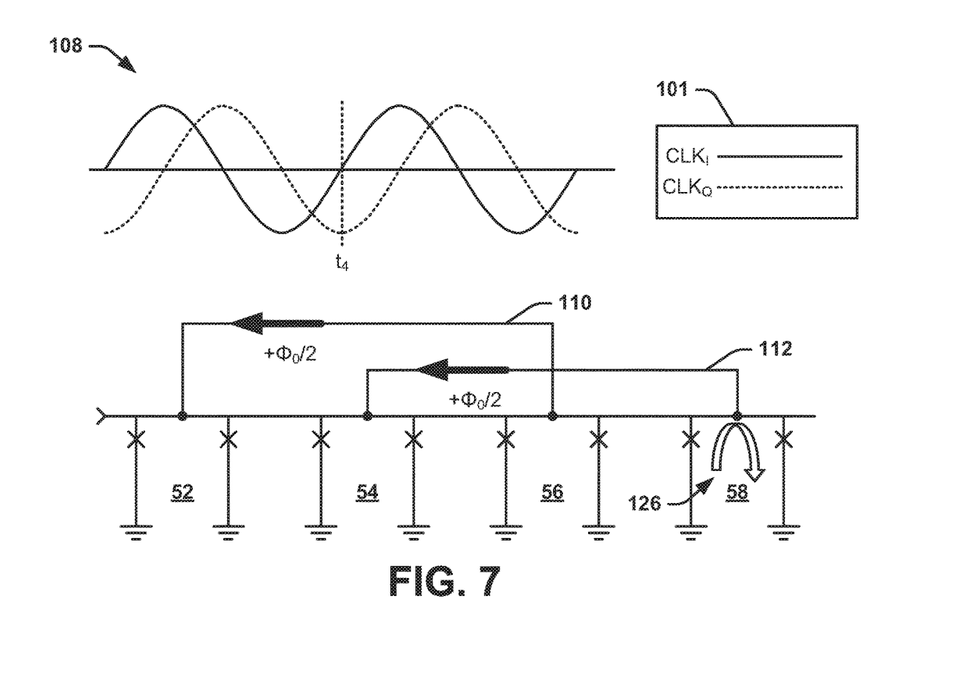
FIG. 7 illustrates yet a further example diagram of flux in a JTL circuit.

FIGS. 3-7 illustrate example diagrams of flux in the JTL circuit 50 of the example of FIG. 2 at each of different phases of the AC clock signal CLK. As described in greater detail herein, FIG. 3 illustrates an example diagram 100 of an initial flux state of the JTL circuit 50. FIG. 4 illustrates an example diagram 102 of the flux of the JTL circuit 50 at the first phase of the in-phase component $CLK_I$, and FIG. 5 illustrates an example diagram 104 of the flux of the JTL circuit 50 at the first phase of the quadrature-phase component $CLK_Q$. Similarly, FIG. 6 illustrates an example diagram 106 of the flux of the JTL circuit 50 at the second phase of the in-phase component $CLK_I$, and FIG. 7 illustrates an example diagram 108 of the flux of the JTL circuit 50 at the second phase of the quadrature-phase component $CLK_Q$.

The diagrams 100, 102, 104, 106, and 108 include the waveform of the AC clock signal CLK, demonstrated as the in-phase component $CLK_I$ and the quadrature-phase component $CLK_Q$, as indicated at a legend 101, as a function of time. The in-phase component $CLK_I$ and the quadrature-phase component $CLK_Q$ are each demonstrated as sinusoidal signals having magnitudes centered about zero. The in-phase component $CLK_I$ and the quadrature-phase component $CLK_Q$ in the example of FIGS. 3-7 can correspond to the in-phase component $CLK_I$ and the quadrature-phase component $CLK_Q$ in the example of FIG. 2. The JTL circuit 50 is demonstrated simplistically in the examples of FIGS. 3-7, and thus without the clock transformers $T_1$, $T_2$, $T_3$, and $T_4$, without the bias transformers $T_{B1}$ and $T_{B2}$, and without any of the inductors in and between the JTL stages 52, 54, 56, and 58. Therefore, the diagrams merely demonstrate a first series loop 110 associated with the first and third JTL stages 52 and 56, and a second series loop 112 associated with the second and fourth JTL stages 54 and 58. In the following description, reference is to be made to the examples of FIGS. 2-7.

As an example, the signal $PLS_{IN}$ can provide an SFQ pulse to the inductor $L_{I\_1}$ at approximately the time $t_0$. At approximately the time $t_0$, the first series loop 110, formed by the first JTL stage 52, the secondary inductors $L_{2\_1}$, $L_{B\_2}$, $L_{2\_3}$, and the third JTL stage 56, has a first flux state (e.g., encloses a flux) of $+\Phi_0/2$, as indicated in the diagram 100 in the example of FIG. 3. The flux state $+\Phi_0/2$ is based on the DC flux bias induced in the secondary inductor $L_{B\_2}$ via the DC flux transformer $T_{B1}$. At the time $t_0$, a positive portion of the in-phase component $CLK_I$ begins, with the first phase (e.g., positive peak) of the in-phase component $CLK_I$ occurring at a time $t_1$ (FIG. 4). Therefore, the in-phase component $CLK_I$ begins to induce a clock current via the secondary inductors $L_{2\_1}$ and $L_{2\_3}$ in a first direction, with current flowing towards the Josephson junctions $J_{1\_1}$ and $J_{2\_1}$ of the first JTL stage 52 based on the inductive coupling with the respective primary inductors $L_{1\_1}$ and $L_{1\_3}$. At a time just prior to the time $t_1$, the induced clock current is combined with the induced bias signal (e.g., via the DC bias current BIAS provided via the secondary inductor $L_{B\_2}$) and the SFQ pulse indicated at 114 in the diagram 102 in the example of FIG. 4. Therefore, the critical current of the Josephson junctions $J_{1\_1}$ and $J_{2\_1}$ is exceeded by the combined current to trigger the Josephson junctions $J_{1\_1}$ and $J_{21}$, thus propagating the SFQ pulse to the second JTL stage 54 via the inductor $L_{I\_2}$ and switching the flux state of the first series loop 110, and thus the first JTL stage 52, from the first flux state of $+\Phi_0/2$ to the second flux state of $-\Phi_0/2$. Additionally, as described in greater detail herein, the switching of the flux state of the first series loop 110 from the first flux state of $+\Phi_0/2$ to the second flux state of $-\Phi_0/2$ resets the third JTL stage 56.

At approximately the time $t_1$, the second series loop 112, formed by the second JTL stage 54, the secondary inductors $L_{2\_2}$, $L_{B\_4}$, $L_{2\_4}$, and the fourth JTL stage 58, has the first flux state (e.g., encloses a flux) of $+\Phi_0/2$, based on the DC flux bias induced in the secondary inductor $L_{B\_4}$ via the DC flux transformer $T_{B2}$, as indicated in the diagram 102 in the example of FIG. 4. At the time $t_1$, a positive portion of the quadrature-phase component $CLK_Q$ begins, with the first phase (e.g., positive peak) of the quadrature-phase component $CLK_Q$ occurring at a time $t_2$ (FIG. 5). Therefore, the quadrature-phase component $CLK_Q$ begins to induce a clock current via the secondary inductors $L_{2\_2}$ and $L_{2\_4}$ in a first direction with current flowing towards the Josephson junctions $J_{1\_2}$ and $J_{2\_2}$ of the second JTL stage 54 based on the inductive coupling with the respective primary inductors $L_{1\_2}$ and $L_{1\_4}$. At a time just prior to the time $t_2$, the induced clock current is combined with the induced bias signal (e.g., via the DC bias current BIAS provided via the secondary inductor $L_{B\_4}$) and the SFQ pulse. Therefore, the critical current of the Josephson junctions $J_{1\_2}$ and $J_{2\_2}$ is exceeded by the combined current to trigger the Josephson junctions $J_{1\_2}$ and $J_{2\_2}$, thus propagating the SFQ pulse indicated at 116 in the diagram 104 in the example of FIG. 5 to the third JTL stage 56 via the inductor $L_{I\_3}$ and switching the flux state of the second series loop 112, and thus the second JTL stage 54, from the first flux state of $+\Phi_0/2$ to the second flux state of $-\Phi_0/2$. Additionally, as described in greater detail herein, the switching of the flux state of the second series loop 112 from the first flux state of $+\Phi_0/2$ to the second flux state of $-\Phi_0/2$ resets the fourth JTL stage 58.

At approximately the time $t_2$, the first series loop 110 has the second flux state of $-\Phi_0/2$, as indicated in the diagram 104 in the example of FIG. 5, based on the DC flux bias induced in the secondary inductor $L_{B\_2}$ via the DC flux transformer $T_{B1}$ and based on the SFQ having propagated through the first JTL stage 52. At the time $t_2$, a negative portion of the in-phase component $CLK_I$ begins, with the second phase (e.g., negative peak) of the in-phase component $CLK_I$ occurring at a time $t_3$ (FIG. 6). Therefore, the in-phase component $CLK_I$ begins to induce a clock current via the secondary inductors $L_{2\_1}$ and $L_{2\_3}$ in a second direction, with current flowing towards the Josephson junctions $J_{1\_3}$ and $J_{2\_3}$ of the third JTL stage 56 based on the inductive coupling with the respective primary inductors $L_{1\_1}$ and $L_{1\_3}$. At a time just prior to the time $t_3$, the induced clock current is combined with the induced bias signal (e.g., via the DC bias current BIAS provided via the secondary inductor $L_{B\_2}$) and the SFQ pulse. Therefore, the critical current of the Josephson junctions $J_{1\_3}$ and $J_{2\_3}$ is exceeded by the combined current to trigger the Josephson junctions $J_{1\_3}$ and $J_{23}$, thus propagating the SFQ pulse indicated at 118 in the diagram 106 in the example of FIG. 6 to the fourth JTL stage 58 via the inductor $L_{I\_4}$ and switching the flux state of the first series loop 110, and thus the third JTL stage 56, from the second flux state of $-\Phi_0/2$ to the first flux state of $+\Phi_0/2$.

In addition, because the flux state of the first series loop 110 is switched from the second flux state of $-\Phi_0/2$ to the first flux state of $+\Phi_0/2$, the first JTL stage 52 is likewise switched from the second flux state of $-\Phi_0/2$ to the first flux state of $+\Phi_0/2$, thus resetting the first JTL stage 52 absent a negative SFQ pulse. In other words, unlike in typical RQL circuit systems that require a negative SFQ pulse to discharge inductive energy and reset the bistable flux state of the inductive bias loop, the JTL circuit 50 is self-resetting with respect to the JTL stages 52, 54, 56, and 58. Therefore, the JTL circuit 50 can propagate the input signal $PLS_{IN}$ as a sequence of unipolar SFQ pulses, and thus does not require negative SFQ pulses to reset the respective JTL stages 52, 54, 56, and 58 upon propagating a SFQ pulse along the respective JTL formed by the JTL stages 52, 54, 56, and 58. The third JTL stage 56 was similarly reset at the time $t_1$, as demonstrated in the diagram 102 of the example of FIG. 4, in which the third JTL stage 56 is reset from the first flux state of $+\Phi_0/2$ to the second flux state of $-\Phi_0/2$ at approximately the time $t_1$, and thus substantially concurrently with the setting of the first JTL stage 52 from the first flux state of $+\Phi_0/2$ to the second flux state of $-\Phi_0/2$.

At approximately the time $t_3$, the second series loop 112 has the second flux state of $-\Phi_0/2$, as indicated in the diagram 106 in the example of FIG. 6. At the time $t_3$, a negative portion of the quadrature-phase component $CLK_Q$ begins, with the first phase of the quadrature-phase component $CLK_Q$ occurring at a time $t_4$ (FIG. 7). Therefore, the quadrature-phase component $CLK_Q$ begins to induce a clock current via the secondary inductors $L_{2\_2}$ and $L_{2\_4}$ in the second direction, with current flowing towards the Josephson junctions $J_{1\_4}$ and $J_{2\_4}$ of the fourth JTL stage 58 based on the inductive coupling with the respective primary inductors $L_{1\_2}$ and $L_{1\_4}$. At a time just prior to the time $t_4$, the induced clock current is combined with the induced bias signal (e.g., via the DC bias current BIAS provided via the secondary inductor $L_{B\_4}$) and the SFQ pulse. Therefore, the critical current of the Josephson junctions $J_{1\_4}$ and $J_{2\_4}$ is exceeded by the combined current to trigger the Josephson junctions $J_{1\_4}$ and $J_{2\_4}$, thus propagating the SFQ pulse, as indicated at 126 in the diagram 108 in the example of FIG. 7 as the output signal $PLS_{OUT}$ and switching the flux state of the second series loop 112, and thus the fourth JTL stage 58, from the second flux state of $-\Phi_0/2$ to the first flux state of $+\Phi_0/2$.

In addition, because the flux state of the second series loop 112 is switched from the second flux state of $-\Phi_0/2$ to the first flux state of $+\Phi_0/2$, the second JTL stage 54 is likewise switched from the second flux state of $-\Phi_0/2$ to the first flux state of $+\Phi_0/2$, thus resetting the second JTL stage 54 absent a negative SFQ pulse. The fourth JTL stage 58 was similarly reset at the time $t_2$, as demonstrated in the diagram 104 of the example of FIG. 5, in which the fourth JTL stage 56 is reset from the first flux state of $+\Phi_0/2$ to the second flux state of $-\Phi_0/2$ at approximately the time $t_2$, as indicated at 128, and thus substantially concurrently with the setting of the second JTL stage 54 from the first flux state of $+\Phi_0/2$ to the second flux state of $-\Phi_0/2$.

Therefore, the examples of FIGS. 2-7 demonstrate a JTL circuit 50 that can propagate the input signal $PLS_{IN}$ as a sequence of unipolar SFQ pulses, and can thus provide self-resetting of the JTL stages 52, 54, 56, and 58 without implementing negative SFQ pulses based on manipulating the flux states of the series loops 158 and 160 that include the respective JTL stages 52, 54, 56, and 58. It is to be understood that the JTL circuit 50 is not intended to be limited to the examples of FIGS. 2-7. As an example, the series order of the transformers $T_1$, $T_{B1}$, and $T_3$ with respect to the series loop 158, and the transformers $T_2$, $T_{B2}$, and $T_4$ with respect to the series loop 160, is not limited to as demonstrated in the example of FIG. 2, but could be any equivalent series order. Additionally, it is to be understood that, while the transformers $T_1$ and $T_3$ and the transformers $T_2$ and $T_4$ are demonstrated as separate transformers having approximately equal mutual inductance, it is to be understood that an equivalent single transformer could be implemented instead of the separate transformers $T_1$ and $T_3$ and/or the separate transformers $T_2$ and $T_4$, with the single transformer having approximately twice the mutual inductance as the separate transformers $T_1$ and $T_3$ and/or the separate transformers $T_2$ and $T_4$. Additionally, the JTL circuit 50 can be a single JTL segment, such that multiple JTL segments can be combined in series to provide a JTL that extends through multiple periods of the AC clock signal CLK. Accordingly, the JTL circuit 50 can be configured in a variety of ways.

Figure 8:
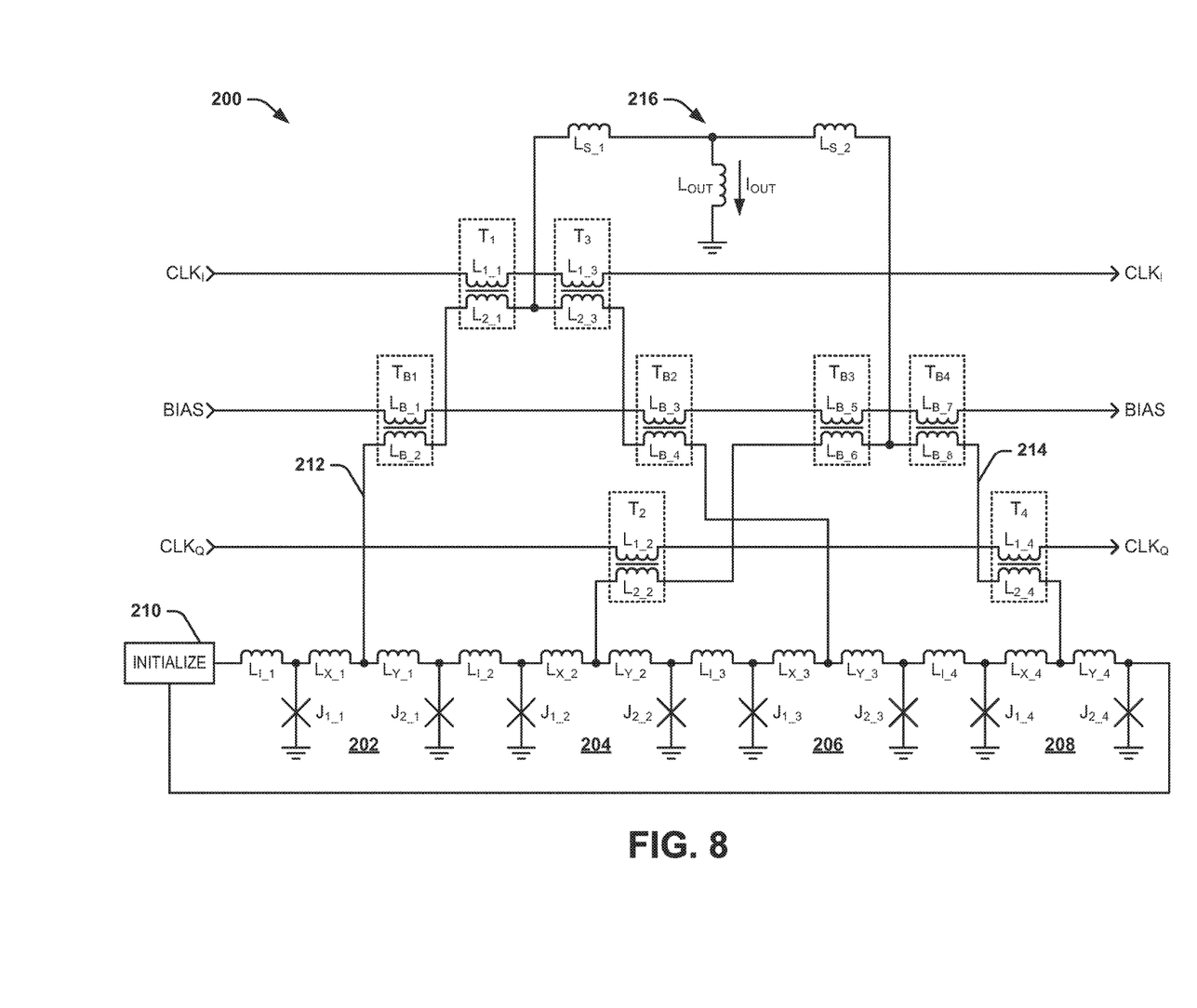
FIG. 8 illustrates an example of a flux-shuttle system.

FIG. 8 illustrates an example of a flux-shuttle system 200. The flux-shuttle system 200 can correspond to a Josephson AC/DC converter that is configured to convert an AC input signal (e.g., the AC clock signal CLK) to a DC output signal. The flux-shuttle system 200 includes a first loop stage 202, a second loop stage 204, a third loop stage 206, and a fourth loop stage 208. The loop stages 202, 204, 206, and 208 are configured substantially similar to the JTL stages 52, 54, 56, and 58 in the example of FIG. 2, and thus are demonstrated in the example of FIG. 8 as SQUIDs. The loop stages 202, 204, 206, and 208 are sequentially arranged in series with respect to each other, and are arranged in a loop, such that the loop stage 208 is coupled in series to the loop stage 202 via an initialization system 210. The initialization system 210 can be any of a variety of arrangements to inject an SFQ pulse into the flux-shuttle system 200 to propagate sequentially through the loop stages 202, 204, 206, and 208, as described in greater detail herein. In the example of FIG. 8, the AC clock signal is demonstrated as a quadrature signal including an in-phase component $CLK_I$ and a quadrature-phase component $CLK_Q$. Therefore, the in-phase component $CLK_I$ and the quadrature-phase component $CLK_Q$ can collectively correspond to the AC clock signal, such as can be implemented for RQL circuits.

Each of the loop stages 202, 204, 206, and 208 are configured substantially similarly with respect to each other, and are each arranged as SQUIDs. The first loop stage 202 includes a first Josephson junction $J_{1\_1}$, a second Josephson junction $J_{2\_1}$, an inductor $L_{X\_1}$, and an inductor $L_{Y\_1}$. The second loop stage 204 includes a first Josephson junction $J_{1\_2}$, a second Josephson junction $J_{2\_2}$, an inductor $L_{X\_2}$, and an inductor $L_{Y\_2}$. The third loop stage 206 includes a first Josephson junction $J_{1\_3}$, a second Josephson junction $J_{2\_3}$, an inductor $L_{X\_3}$, and an inductor $L_{Y\_3}$. The fourth loop stage 208 includes a first Josephson junction $J_{1\_4}$, a second Josephson junction $J_{2\_4}$, an inductor $L_{X\_4}$, and an inductor $L_{Y\_4}$. The first loop stage 202 receives an SFQ pulse from either the initialization system 210 or from the fourth loop stage 208 via an inductor $L_{I\_1}$ and is separated from the second loop stage 204 by an inductor $L_{I\_2}$. The second loop stage 204 and the third loop stage 206 are separated by an inductor $L_{I\_3}$, and the third loop stage 206 and the fourth loop stage 208 are separated by an inductor $L_{I\_4}$. After the fourth loop stage 208, the flux-shuttle system 200 can output the SFQ pulse back to the first loop stage 202. Therefore, the SFQ pulse that is generated in the initialization system 210 can circulate through the flux-shuttle system 200 in the loop formed by the loop stages 202, 204, 206, and 208.

The flux-shuttle system 200 also includes a plurality of clock transformers that are associated with each of the loop stages 202, 204, 206, and 208. In the example of FIG. 8, the clock transformers include a first clock transformer $T_1$ that is associated with the first loop stage 202, a second clock transformer $T_2$ that is associated with the second loop stage 204, a third clock transformer $T_3$ that is associated with the third loop stage 206, and a fourth clock transformer $T_4$ that is associated with the fourth loop stage 208. Additionally, the flux-shuttle system 200 includes a first bias transformer $T_{B1}$ and a second bias transformer $T_{B2}$ that are associated with the first and third loop stages 202 and 206, and includes a third bias transformer $T_{B3}$ and a fourth bias transformer $T_{B4}$ that is associated with the second and fourth loop stages 204 and 208.

The clock transformers $T_1$ and $T_3$ include primary inductors $L_{1\_1}$ and $L_{1\_3}$, respectively, through which the in-phase component $CLK_I$ flows, and the clock transformers $T_2$ and $T_4$ include primary inductors $L_{1\_2}$ and $L_{1\_4}$, respectively, through which the quadrature-phase component $CLK_Q$ flows. In addition, the bias transformers $T_{B1}$, $T_{B2}$, $T_{B3}$, and $T_{B4}$ include primary inductors $L_{B\_1}$, $L_{B\_3}$, $L_{B\_5}$, and $L_{B\_7}$ through which a DC bias signal BIAS flows. The clock transformer $T_1$ provides inductive coupling of the in-phase component $CLK_I$ to the first loop stage 202 via a secondary inductor $L_{2\_1}$ that is coupled between the inductors $L_{X\_1}$ and $L_{Y\_1}$. Similarly, the clock transformer $T_3$ provides inductive coupling of the in-phase component $CLK_I$ to the third loop stage 206 via a secondary inductor $L_{2\_3}$ that is coupled between the inductors $L_{X\_3}$ and $L_{Y\_3}$. In the example of FIG. 8, the bias transformers $T_{B1}$ and $T_{B2}$ include respective secondary inductors $L_{B\_2}$ and $L_{B\_4}$ that are arranged in series with each other and with the secondary inductors $L_{2\_1}$ and $L_{2\_3}$ to form a first series loop 212 between the first and third loop stages 202 and 206. In a similar manner, the clock transformer $T_2$ provides inductive coupling of the quadrature-phase component $CLK_Q$ to the second loop stage 204 via a secondary inductor $L_{2\_2}$ that is coupled between the inductors $L_{X\_2}$ and $L_{Y\_2}$. Similarly, the clock transformer $T_4$ provides inductive coupling of the quadrature-phase component $CLK_Q$ to the fourth loop stage 208 via a secondary inductor $L_{2\_4}$ that is coupled between the inductors $L_{X\_4}$ and $L_{Y\_4}$. In the example of FIG. 8, the bias transformers $T_{B3}$ and $T_{B4}$ include respective secondary inductors $L_{B\_6}$ and $L_{B\_8}$ that are arranged in series with the secondary inductors $L_{2\_2}$ and $L_{2\_4}$ to form a second series loop 214 between the second and fourth loop stages 204 and 208.

Similar to as described previously regarding the example of FIGS. 2-7, based on the arrangement of the clock transformers $T_1$, $T_2$, $T_3$, and $T_4$ relative to the respective loop stages 202, 204, 206, and 208, a flux state of the loop stages 202, 204, 206, and 208 can be sequentially switched at each phase and each opposite phase of the in-phase and quadrature-phase components $CLK_I$ and $CLK_Q$. As an example, each of the first in-phase component $CLK_I$ and the quadrature-phase component $CLK_Q$ can include a first phase corresponding to a positive peak (e.g., in a first half of a respective period) and a second phase that is opposite the first phase, and thus corresponding to a negative peak (e.g., in a second half of a respective period). Thus, the flux-shuttle system 200 can track the flux state of the secondary inductors $L_{B\_2}$ and $L_{B\_4}$ of the bias transformers $T_{B1}$ and $T_{B2}$ in the first series loop 212 and the flux state of the secondary inductors $L_{B\_6}$ and $L_{B\_8}$ of the bias transformers $T_{B3}$ and $T_{B4}$ in the second series loop 214, and thus the flux state of the loop stages 202, 204, 206, and 208 through each alternating first and second phase of the in-phase and quadrature-phase components $CLK_I$ and $CLK_Q$. Accordingly, the flux shuttle system 200 can propagate an SFQ pulse in one of the JTL stages 202, 204, 206, and 208 to set the flux state of the respective one of the JTL stages 202, 204, 206, and 208 and to concurrently reset the flux state of an associated one of the JTL stages 202, 204, 206, and 208 in the same series loop.

Furthermore, the flux-shuttle system 200 includes a first storage inductor $L_{S\_1}$ that interconnects an output node 216 and the first series loop 212, and a second storage inductor $L_{S\_2}$ that interconnects the output node 216 and the second series loop 214. The flux-shuttle system 200 further includes an output inductor $L_{OUT}$ that conducts an output current $I_{OUT}$ from the output node 216. In response to the SFQ pulse that is sequentially propagated through each of the loop stages 202, 204, 206, and 208, a current step is generated in the respective storage inductors $L_{S\_1}$ and $L_{S\_2}$. Thus, in response to the respective Josephson junctions triggering in the first and third loop stages 202 and 206 in response to the switching of the flux states of the respective first and third loop stages 202 and 206, the SFQ pulse generates a resulting current step in the storage inductor $L_{S\_1}$. Similarly, in response to the respective Josephson junctions triggering in the second and fourth loop stages 204 and 208 in response to the switching of the flux states of the respective second and fourth loop stages 204 and 208, the SFQ pulse generates a resulting current step in the storage inductor $L_{S\_2}$. As a result, the output inductor $L_{OUT}$ integrates each of the current steps provided through the storage inductors $L_{S\_1}$ and $L_{S\_2}$ to provide the output current $I_{OUT}$, such that the flux-shuttle loop 200 acts as a DC signal source. As a result, the output current $I_{OUT}$ can be provided as a DC signal converted from the in-phase component $CLK_I$ and the quadrature-phase component $CLK_Q$, such as to a circuit device (e.g., a peripheral device in a memory system).

Figure 9:
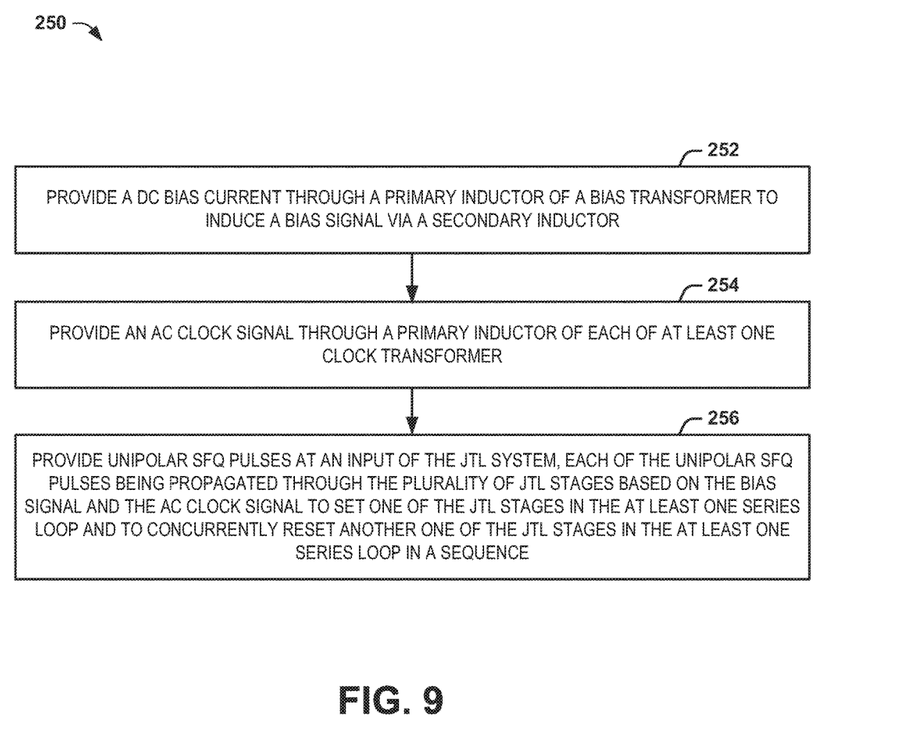
FIG. 9 illustrates an example of a method for propagating an SFQ pulse in a JTL system.

Therefore, the example of FIG. 8 demonstrates a flux-shuttle system 200 that can propagate an SFQ pulse and provide self-resetting of the loop stages 202, 204, 206, and 208, and thus without implementing a negative SFQ pulse to reset the flux state of the bias transformers $T_{B1}$, $T_{B2}$, $T_{B3}$, and $T_{B4}$ in the flux-shuttle system 200. It is to be understood that the flux-shuttle system 200 is not intended to be limited to the example of FIG. 8, such as in ways similar to as described previously regarding the examples of FIGS. 2-7. Accordingly, the flux-shuttle system 200 can be configured in a variety of ways In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 250 for propagating an SFQ pulse in a JTL system (e.g., the JTL system 10). At 252, a DC bias current (e.g., the DC bias current BIAS) is provided through a primary inductor (e.g., primary inductors $L_{B\_1}$ and $L_{B\_3}$) of a bias transformer (e.g., the bias transformers $T_{B1}$ and $T_{B2}$) to induce a bias signal via a secondary inductor (e.g., secondary inductors $L_{B\_2}$ and $L_{B\_4}$). At 254, an AC clock signal (e.g., the AC clock signal CLK) is provided through a primary inductor (e.g., primary inductors $L_{1\_1}$ and $L_{1\_3}$ and the primary inductors $L_{1\_2}$ and $L_{1\_4}$) of each of at least one clock transformer (e.g., the clock transformers $T_1$, $T_2$, $T_3$, and $T_4$). The at least one clock transformer can include secondary inductors (e.g., secondary inductors $L_{2\_1}$ and $L_{2\_3}$ and the secondary inductors $L_{2\_2}$ and $L_{2\_4}$) arranged in series with the secondary inductor associated with the bias transformer in a loop with at least two of a plurality of JTL stages (e.g., the JTL stages 52, 54, 56, and 58) of the JTL. At 256, providing unipolar SFQ pulses (e.g., via the input signal $PLS_{IN}$) at an input of the JTL, each of the unipolar SFQ pulses being propagated through the plurality of JTL stages based on the bias signal and each respective one of the JTL stages switching to one of a first flux state and a second flux state in response to the respective one of the unipolar SFQ pulses and a first phase of the AC clock signal, wherein the plurality of JTL stages sequentially switches to the other of the first flux state and the second flux state in response to a second phase of the AC clock signal that is opposite the first phase.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A Josephson transmission line (JTL) system comprising a first JTL stage, a second JTL stage, a third JTL stage, and a fourth JTL stage;

wherein the first JTL stage is controlled via at least one first clock transformer comprising a respective at least one primary inductor that carries an in-phase component of an AC clock signal and a respective at least one secondary inductor that is arranged in a first series loop with the first JTL stage, the first JTL stage being set in response to an SFQ pulse propagating through the first JTL stage at a first phase of the in-phase component and being reset in response to the SFQ pulse propagating through the third JTL stage at a second phase of the in-phase component opposite the first phase;

wherein the second JTL stage is arranged in series with the first JTL stage, the second JTL stage being controlled via at least one second clock transformer comprising a respective at least one primary inductor that carries a quadrature-phase component of the AC clock signal and a respective at least one secondary inductor that is arranged in a second series loop with the second JTL stage, the second JTL stage being set in response to the SFQ pulse propagating through the second JTL stage at a first phase of the quadrature-phase component and being reset in response to the SFQ pulse propagating through the fourth JTL stage at a second phase of the quadrature-phase component opposite the first phase;

wherein the third JTL stage arranged in series with the second JTL stage, the third JTL stage being controlled via the first clock transformer and is arranged in the first series loop, the third JTL stage being set in response to the SFQ pulse propagating through the third JTL stage at the second phase of the in-phase component and being reset in response to the SFQ pulse propagating through the first JTL stage at the first phase of the in-phase component; and wherein the fourth JTL stage arranged in series with the third JTL stage, the fourth JTL stage being controlled via the second clock transformer and is arranged in the second series loop, the fourth JTL stage being set in response to the SFQ pulse propagating through the fourth JTL stage at the second phase of the quadrature-phase component and being reset in response to the SFQ pulse propagating through the second JTL stage at the first phase of the quadrature-phase component.

2. The system of claim 1, further comprising:

a first bias transformer comprising a primary inductor configured to carry a DC bias signal and comprising a secondary inductor that is arranged in series with the secondary inductors of the first clock transformer in the first series loop, the DC bias signal being inductively provided to propagate the SFQ pulse through the first JTL stage to set the first JTL stage and to reset the third JTL stage at the first phase of the in-phase component, and to propagate the SFQ pulse through the third JTL stage to set the third JTL stage and to reset the first JTL stage at the second phase of the in-phase component; and a second bias transformer comprising a primary inductor configured to carry the DC bias signal and comprising a secondary inductor that is arranged in series with the secondary inductors of the second clock transformer in the second series loop, the DC bias signal being inductively provided to propagate the SFQ pulse through the second JTL stage to set the second JTL stage and to reset the fourth JTL stage at the first phase of the quadrature-phase component and to propagate the SFQ pulse through the fourth JTL stage to set the fourth JTL stage and to reset the second JTL stage at the second phase of the quadrature-phase component.

3. The system of claim 1, wherein the first clock transformer and the second clock transformer are arranged with respect to the AC clock signal such that the first clock transformer and the second clock transformer are configured to switch the respective first and second series loops between the first and second flux states in response to the SFQ pulse and the respective in-phase and quadrature-phase components of the AC clock signal absent a negative SFQ pulse.

4. The system of claim 1, wherein each of the first, second, third, and fourth JTL stages comprises a first Josephson junction, a second Josephson junction, and an inductor interconnecting the first and second Josephson junctions and being coupled to the secondary inductor of a respective one of the first clock transformer and the second clock transformer, the first and second Josephson junctions and the inductor being arranged as a superconducting quantum interference device (SQUID).

5. The system of claim 1, wherein the first, second, third, and fourth JTL stages are arranged in a series loop to form a flux-shuttle, wherein each of the first, second, third, and fourth JTL stages comprises at least one Josephson junction, the first, second, third, and fourth JTL stages being spaced about the flux shuttle loop and being configured to sequentially trigger the respective at least one Josephson junction in response to the AC clock signal and to propagate the SFQ pulse sequentially and continuously through each of the first, second, third, and fourth JTL stages around the flux-shuttle loop via each of the Josephson junction of each of the respective first, second, third, and fourth JTL stages to provide a DC output signal through an output inductor.

6. A Josephson transmission line (JTL) system comprising:

a first JTL stage configured to receive a single flux quantum (SFQ) pulse at an input, the first JTL stage being set to propagate the SFQ pulse in response to a first phase of an in-phase AC clock signal and being reset in response to a second phase of the in-phase AC clock signal that is opposite the first phase of the in-phase AC clock signal;

a second JTL stage coupled to the first JTL stage and being set to propagate the SFQ pulse in response to a first phase of a quadrature-phase AC clock signal and being reset in response to a second phase of the quadrature-phase AC clock signal that is opposite the first phase of the quadrature-phase AC clock signal;

a third JTL stage coupled to the second JTL stage and being set to propagate the SFQ pulse in response to the second phase of the in-phase AC clock signal and being reset in response to the first phase of the in-phase AC clock signal;

a fourth JTL stage coupled to the third JTL stage and being set to propagate the SFQ pulse in response to the second phase of the quadrature-phase AC clock signal and being reset in response to the first phase of the quadrature-phase AC clock signal;

a first series loop comprising the first JTL stage, the third JTL stage, and at least one first inductive current source configured to provide the in-phase AC clock signal; and a second series loop comprising the second JTL stage, the fourth JTL stage, and at least one second inductive current source configured to provide the quadrature-phase AC clock signal.

7. The system of claim 6, wherein the first inductive current source is configured as a secondary inductor of a first transformer, wherein the first transformer further comprises a primary inductor configured to propagate the in-phase AC clock signal, and wherein the second inductive current source is configured as a secondary inductor of a second transformer, wherein the second transformer further comprises a primary inductor configured to propagate the quadrature-phase AC clock signal.

8. The system of claim 7, further comprising:

A first bias transformer comprising a primary inductor configured to propagate a DC bias signal and comprising a secondary inductor that is arranged in series with the secondary inductor of each of the at least one first clock transformer in the first series loop, the DC bias signal being inductively provided to set the first and third JTL stages to the respective one of the first and second flux states in response to the SFQ pulse and the first phase of the in-phase component to propagate the SFQ pulse and to set the first and third JTL stages to the respective one of the second and first flux states in response to the second phase of the in-phase component; and a second bias transformer comprising a primary inductor configured to propagate the DC bias signal and comprising a secondary inductor that is arranged in series with the secondary inductors of the second clock transformer in the second series loop, the DC bias signal being inductively provided to set the second and fourth JTL stages to the respective one of the first and second flux states in response to the SFQ pulse and the first phase of the quadrature-phase component to propagate the SFQ pulse and to set the second and fourth of JTL stages to the respective one of the second and first flux states in response to the second phase of the quadrature-phase component.

9. The system of claim 7, wherein the at least one first clock transformer and the at least one second clock transformer are each arranged with respect to the AC clock signal such that each of the first clock transformer and each of the second clock transformer are configured to set the respective first, second, third, and fourth JTL stages between the first and second flux states in response to the SFQ pulse and the first phase of the respective in-phase and quadrature-phase of the component to propagate the SFQ pulse, and to set the respective first, second, third, and fourth JTL stages between the second and first flux states in response to the second phase of the respective in-phase and quadrature-phase of the component absent a negative SFQ pulse.

10. The system of claim 7, wherein each of the first, second, third, and fourth JTL stages comprises a first Josephson junction, a second Josephson junction, and an inductor interconnecting the first and second Josephson junctions and being coupled to the secondary inductor of a respective one of the first clock transformer and the second clock transformer, the first and second Josephson junctions and the inductor being arranged as a superconducting quantum interference device (SQUID).

11. The system of claim 6, wherein the first, second, third, and fourth JTL stages are arranged in a series loop to form a flux-shuttle, wherein each of the first, second, third, and fourth JTL stages comprises at least one Josephson junction, the first, second, third, and fourth JTL stages being spaced about the flux shuttle loop and being configured to sequentially trigger the respective at least one Josephson junction in response to the component and to propagate the SFQ pulse sequentially and continuously through each of the first, second, third, and fourth JTL stages around the flux-shuttle loop via each of the Josephson junction of each of the respective first, second, third, and fourth JTL stages to provide a DC output signal through an output inductor.

* * * * *